United States Patent
Besser et al.

(10) Patent No.: US 8,691,689 B1
(45) Date of Patent: Apr. 8, 2014

(54) METHODS FOR FABRICATING INTEGRATED CIRCUITS HAVING LOW RESISTANCE DEVICE CONTACTS

(71) Applicant: GLOBALFOUNDRIES Inc., Grand Cayman (KY)

(72) Inventors: Paul R. Besser, Sunnyvale, CA (US); Sean X. Lin, Watervliet, NY (US); Valli Arunachalam, Pleasant Valley, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/689,839

(22) Filed: Nov. 30, 2012

(51) Int. Cl.
*H01L 21/44* (2006.01)

(52) U.S. Cl.
USPC ........... 438/653; 438/622; 438/628; 438/629; 438/675; 438/678; 257/E21.582

(58) Field of Classification Search
None
See application file for complete search history.

(56) References Cited

U.S. PATENT DOCUMENTS

2008/0076244 A1* 3/2008 Ye et al. .................. 438/597

* cited by examiner

*Primary Examiner* — Kyoung Lee
(74) *Attorney, Agent, or Firm* — Ingrassia Fisher & Lorenz, P.C.

(57) ABSTRACT

Methods for fabricating integrated circuits having low resistance device contacts are provided. One method includes depositing an ILD layer of insulating material overlying a device region that includes a metal silicide region. The ILD layer is etched to form a sidewall that defines a contact opening formed through the ILD layer exposing the metal silicide region. A liner is formed overlying the sidewall and the metal silicide region and defines an inner cavity in the contact opening. A copper layer is formed overlying the liner and at least partially filling the inner cavity. The copper layer is etched to expose an upper portion of the liner while leaving a copper portion disposed in a bottom portion of the inner cavity. Copper is electrolessly deposited on the copper portion to fill a remaining portion of the inner cavity.

20 Claims, 12 Drawing Sheets

METHODS FOR FABRICATING INTEGRATED CIRCUITS HAVING LOW RESISTANCE DEVICE CONTACTS

TECHNICAL FIELD

The present invention relates generally to integrated circuits, and more particularly relates to methods for fabricating integrated circuits having low resistance device contacts.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS integrated circuit (IC). There is a continuing trend to incorporate more and more circuitry on a single IC chip. To incorporate the increasing amount of circuitry, the size of each individual device in the circuit and the size and spacing between device elements (the feature size) must decrease.

The individual devices of the circuits, including MOS transistors and other passive and active circuit elements, must be interconnected by metal or other conductors to implement a desired circuit function. Some small resistance is associated with each contact between the conductor and the circuit device and within the conductor itself. As the feature size decreases, the contact resistance increases and becomes a greater and greater percentage of the total circuit resistance. As feature sizes decrease from 150 nanometer (nm) to 90 nm, then to 45 nm and below, the contact resistance becomes more and more important. At feature sizes of 32 nm, the contact resistance likely will dominate chip performance unless some innovation changes the present trend.

Contact to a circuit device, such as an MOS transistor, is often formed by etching a contact opening in an insulating material overlying the circuit device to expose a metal silicide region of the device and filling the contact opening with a conductive metal plug of, for example, tungsten or copper. A conductive interconnect then is formed overlying the insulating material and electrically coupled to the contact plug. Presently, tungsten and copper both create challenges to fabrication of low resistance contact plugs. Tungsten typically creates high resistance in contacts with high aspect ratios. While copper, despite exhibiting lower resistance than tungsten, typically forms copper plugs with voids when deposited in relatively small contact openings. The presence of voids within the copper contact can increase the resistance of the contact and adversely affect the electrical characteristics of the resulting device.

Accordingly, it is desirable to provide methods for fabricating integrated circuits having low resistance device contacts. Furthermore, other desirable features and characteristics of the present invention will become apparent from the subsequent detailed description and the appended claims, taken in conjunction with the accompanying drawings and the foregoing technical field and background.

BRIEF SUMMARY

Methods for fabricating integrated circuits having device contacts are provided herein. In accordance with an exemplary embodiment, a method for fabricating an integrated circuit having a device contact includes depositing an ILD layer of insulating material overlying a device region that includes a metal silicide region. The ILD layer is etched to form a sidewall that defines a contact opening formed through the ILD layer exposing the metal silicide region. A liner is formed overlying the sidewall and the metal silicide region and defines an inner cavity in the contact opening. A copper layer is formed overlying the liner and at least partially filling the inner cavity. The copper layer is etched to expose an upper portion of the liner while leaving a copper portion disposed in a bottom portion of the inner cavity. Copper is electrolessly deposited on the copper portion to fill a remaining portion of the inner cavity.

In accordance with another exemplary embodiment, a method for fabricating an integrated circuit having a device contact is provided. The method includes forming an ILD layer of insulating material overlying a device region that includes a metal silicide region. The ILD layer is etched to form a sidewall that defines a contact opening formed through the ILD layer exposing the metal silicide region. A liner is formed overlying the sidewall and the metal silicide region and defines an inner cavity in the contact opening. A copper seed layer is deposited overlying the liner. The copper seed layer is reflowed to form a reflowed copper seed layer that partially fills the inner cavity. The reflowed copper seed layer is etched to expose an upper portion of the liner while leaving a copper portion disposed in a bottom portion of the inner cavity. Copper is electrolessly deposited on the copper portion to fill a remaining portion of the inner cavity.

In accordance with another exemplary embodiment, a method for fabricating an integrated circuit having a device contact is provided. The method includes forming an ILD layer of insulating material overlying a device region that includes a metal silicide region. The ILD layer is etched to form a sidewall that defines a contact opening formed through the ILD layer exposing the metal silicide region. A liner is formed overlying the sidewall and the metal silicide region and defining an inner cavity in the contact opening. The inner cavity is filled with copper to define a copper fill. The copper fill is etched to expose an upper portion of the liner while leaving a copper portion disposed in a bottom portion of the inner cavity. Copper is electrolessly deposited on the copper portion to fill a remaining portion of the inner cavity.

BRIEF DESCRIPTION OF THE DRAWINGS

The present invention will hereinafter be described in conjunction with the following drawing figures, wherein like numerals denote like elements.

FIGS. 1-8 illustrate the integrated circuit in cross sectional view during various stages of its fabrication.

DETAILED DESCRIPTION

Figure 1:
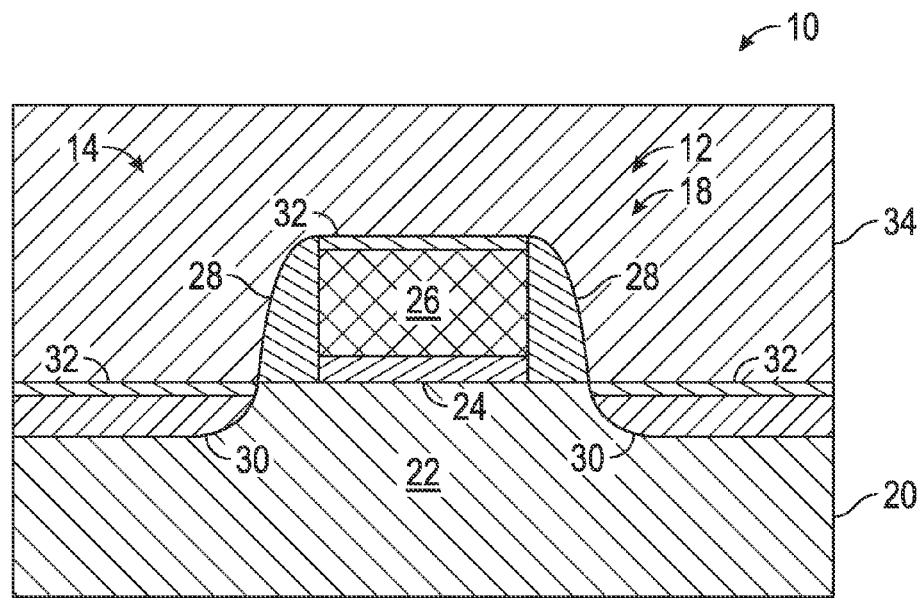
FIGS. 1-8 illustrate methods for fabricating integrated circuits having device contacts in accordance with various embodiments.

The following Detailed Description is merely exemplary in nature and is not intended to limit the invention or the application and uses of the invention. Furthermore, there is no intention to be bound by any theory presented in the preceding background or the following detailed description.

Various embodiments contemplated herein relate to methods for fabricating integrated circuits having low resistance device contacts. During intermediate stages of the fabrication of an integrated circuit (IC), an interlayer dielectric (ILD) layer of insulating material is formed overlying a device region that includes a metal silicide region. The ILD layer is etched to form a sidewall that defines a contact opening. The contact opening is formed through the ILD layer exposing the metal silicide region. A liner is formed overlying the sidewall and the metal silicide region and defines an inner cavity in the contact opening. In an exemplary embodiment, the liner includes at least a barrier layer that helps prevent migration of copper through the liner. A copper layer is formed overlying the liner and at least partially fills the inner cavity. The copper layer is etched to remove copper from an upper portion of the liner, thereby exposing the upper portion of the liner, while leaving some copper disposed in a bottom portion of the inner cavity. In an exemplary embodiment, the upper portion of the liner is substantially free of copper. Copper is then electrolessly deposited on the copper in the bottom portion to fill a remaining portion of the inner cavity with copper. Because the upper portion of the liner is substantially free of copper when copper is electrolessly deposited, copper grows substantially in one direction from the bottom portion to the top of the inner cavity to form a substantially void-free copper plug instead of growing copper in multiple competing directions, e.g., from both the bottom portion of the inner cavity and the upper portion of the liner, that might otherwise form trapped spaces or voids in the copper plug. As such, the substantially void-free copper plug is a substantially solid, highly conductive copper plug that effectively functions as a relatively low resistance device contact.

FIGS. 1-8 illustrate methods for fabricating an IC 10 including a semiconductor device 12 that is disposed along a device region 14 with device contacts 16 in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portions of the IC 10 include only a single semiconductor device 12, although those of ordinary skill in the art will recognize that an actual IC can include a large number of such semiconductor devices. The semiconductor device 12 may be a diode, a bipolar transistor, a MOS device, or the like. For purposes of illustration, FIGS. 1-8 illustrate the semiconductor device 12 as a MOS device. Various steps in the manufacture of ICs and MOS devices are well known and so, in the interest of brevity, many conventional steps will only be mentioned briefly herein or will be omitted entirely without providing the well-known process details. Although the term "MOS device" properly refers to a semiconductor device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

FIG. 1 illustrates, in cross sectional view, a portion of the IC 10 at an intermediate stage of fabrication in accordance with an exemplary embodiment. As illustrated, the semiconductor device 12 is a MOS transistor 18, which can be N-channel or P-channel MOS transistor. The MOS transistor 18 is fabricated on a silicon substrate 20, which can be either a bulk silicon wafer as illustrated or a thin silicon layer on an insulating substrate (SOI). As used herein, the terms "silicon layer" and "silicon substrate" will be used to encompass the relatively pure or lightly impurity-doped monocrystalline silicon materials typically used in the semiconductor industry as well as silicon admixed with other elements such as germanium, carbon, and the like to form a substantially monocrystalline semiconductor material. At least a surface portion 22 of the silicon substrate 20 is doped with P-type conductivity-determining impurities for the fabrication of a N-channel MOS transistor or with N-type conductivity-determining impurities for the fabrication of a P-channel MOS transistor. The surface portion 22 can be impurity doped, for example, by the implantation and subsequent thermal annealing of dopant ions such as boron or arsenic ions.

A layer of gate insulating material 24 is formed at the surface of the surface portion 22 and a gate electrode 26 is formed overlying the layer of gate insulating material 24 and the surface portion 22. The layer of gate insulating material 24 can be a layer of thermally grown silicon dioxide, or alternatively, a deposited insulator such as a silicon oxide, silicon nitride, a high dielectric constant insulator such as hafnium silicate ($HfSiO_x$, where x is greater than zero), or the like. The deposited insulators can be deposited, for example, by chemical vapor deposition (CVD), low pressure chemical vapor deposition (LPCVD), or plasma enhanced chemical vapor deposition (PECVD). The layer of gate insulating material 24 may have a thickness of from about 1 to about 10 nm, although the actual thickness can be determined based on the application of the transistor in the circuit being implemented. The gate electrode 26 includes an electrically conductive material, such as a metal or metal alloy, or a material that can be made electrically conductive and formed by depositing, patterning, and etching, for example, a layer of polycrystalline silicon, such as a layer of undoped polycrystalline silicon. The gate electrode 26 generally has a thickness of from about 50 to about 300 nm. The polycrystalline silicon can be deposited, for example, by the reduction of silane in a CVD reaction. Sidewall spacers 28 are formed on the sidewalls of the gate electrode 26. The sidewall spacers 28 are formed by depositing a layer of insulating material such as silicon oxide and/or silicon nitride and subsequently anisotropically etching the insulating layer, for example by reactive ion etching (RIE). Alternatively, silicon oxide and silicon nitride can be etched, for example, in a $CHF_3$, $CF_4$, or $SF_6$ chemistry. Conductivity-determining ions are implanted into the silicon substrate 20 to form source and drain regions 30. If the surface portion 22 of the silicon substrate 20 is P-type, N-type conductivity-determining ions are implanted to form N-type source and drain regions in the silicon substrate 20 and to conductivity dope the gate electrode 26 with N-type impurities. The implanted ions can be, for example, either phosphorus or arsenic ions. Alternatively, if the surface portion 22 of the silicon substrate 20 is N-type, P-type conductivity-determining ions are implanted to form P-type source and drain regions in the silicon substrate 20 and to conductivity dope the gate electrode 26 with P-type impurities. The implanted ions can be, for example, boron ions. The source and drain regions 30 are self-aligned with the gate electrode 26. As those of skill in the art will appreciate, additional sidewall spacers and additional implantations may be employed to create drain extensions, halo implants, deep source and drains, and the like.

In accordance with an exemplary embodiment, a layer of silicide-forming metal (not shown) is deposited over the device region 14 and in contact with the source and drain regions 30 and the gate electrode 26. Examples of silicide-forming metals include, but are not limited to, nickel, cobalt, and alloys thereof. The silicide-forming metal can be deposited, for example by sputtering, to a thickness of from about 4 to about 50 nm, such as about 10 nm. In one embodiment, the device region 14 with the silicide-forming metal is heated, for example by RTA, to cause the silicide-forming metal to react with exposed silicon to form metal silicide regions 32 at the surface of the source and drain regions 30 and the gate electrode 26. The metal silicide forms only in those areas where there is exposed silicon. Metal silicide does not form, and the silicide forming metal remains unreacted, in those areas where there is no exposed silicon, such as on the sidewall spacers 28. The unreacted silicide-forming metal can be removed by wet etching in a $H_2O_2/H_2SO_4$ or $HNO_3/HCl$ solution. After the formation of metal silicide regions 32, an ILD layer 34 of insulating material (e.g., dielectric material such as silicon oxide) is deposited overlying the device region 14. In an exemplary embodiment, the ILD layer 34 is deposited by a low temperature process and may be deposited, for example by a LPCVD process.

Figure 2:
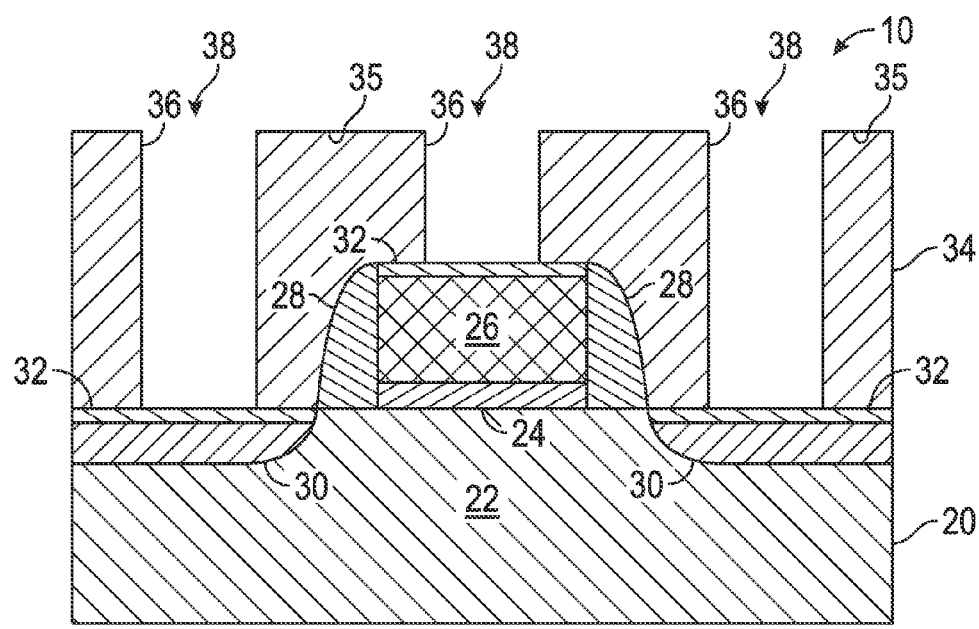

Referring to FIG. 2, in an exemplary embodiment, a top surface 35 of the ILD layer 34 is planarized, for example by a chemical mechanical planarization (CMP) process. The ILD layer 34 is etched to form sidewalls 36 that correspondingly define contact openings 38 (e.g., vias) formed through the ILD layer 34 exposing the metal silicide regions 32. As illustrated, the contact openings 38 expose portions of the metal silicide regions 32 on the source and drain regions 30 and the gate electrode 26. Depending on the circuit being implemented, however, the contact opening 38 to the gate electrode 26 may or may not be formed.

Figure 3:
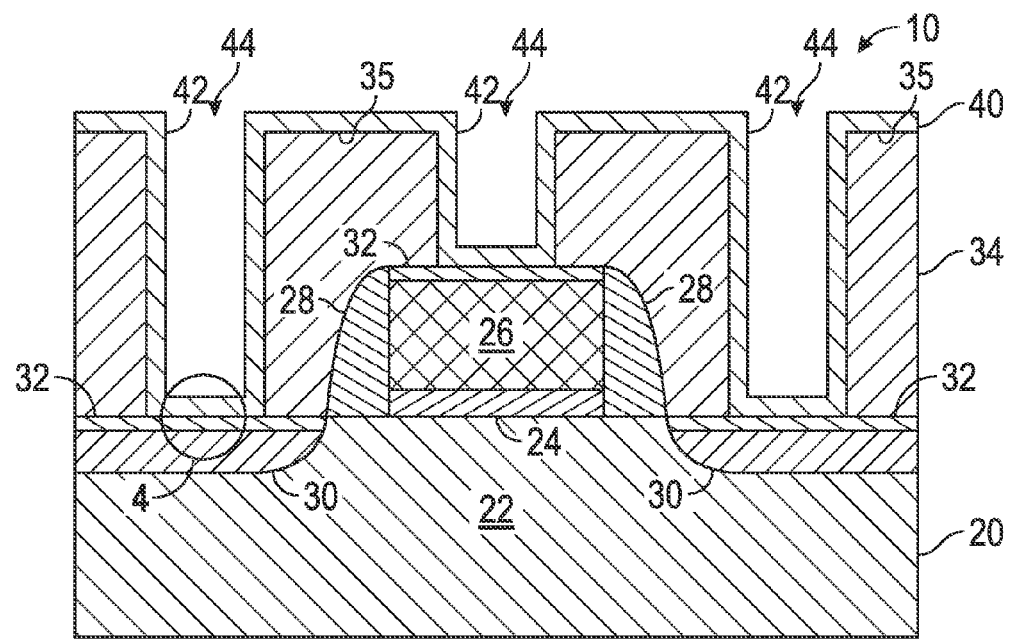

FIG. 3 illustrates, in cross sectional view, the IC 10 at a further advanced fabrication stage in accordance with an exemplary embodiment. A liner-forming material(s) 40 is deposited overlying the top surface 35 of the ILD layer 34, the sidewalls 36, and the metal silicide regions 32 to define liners 42 correspondingly disposed in the contact openings 38. As illustrated, the liners 42 are formed directly on the sidewalls 36 and the metal silicide regions 32 and define inner cavities 44 correspondingly in the contact openings 38.

Figure 4A:
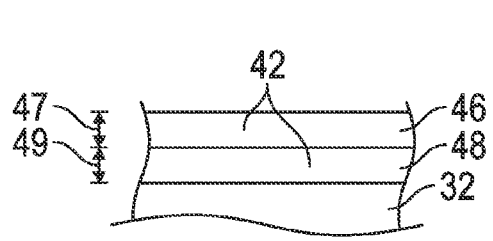
Figure 4B:
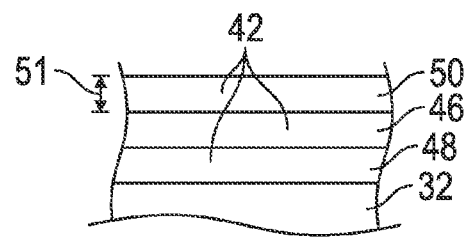

FIGS. 4A and 4B are enlarged views of one of the liners 42 depicted in FIG. 3 along an area indicated by single headed arrow 4 in accordance with various exemplary embodiments. Referring to FIGS. 3 and 4A, in an exemplary embodiment, the liners 42 each includes at least a barrier layer 46 that substantially prevents migration of copper through the corresponding liner 42. In one example, the barrier layer 46 is formed of titanium nitride (TiN). In another example, the barrier layer 46 is formed of tantalum nitride (TaN). The barrier layer 46 may be formed by depositing TiN or TaN overlying the sidewall 36 and the metal silicide region 32 using a CVD process or an atomic layer deposition (ALD) process. In an exemplary embodiment, the barrier layer 46 has a thickness (indicated by double headed arrow 47) of from about 1 to about 10 nm, such as about 2 to about 4 nm, for example about 3 nm.

As illustrated, one or more of the liners 42 may also include a conductive layer 48 for lowering resistance correspondingly between the device contact 16 (see FIG. 8) and the metal silicide region 32. In an exemplary embodiment, the conductive layer 48 is formed by depositing substantially pure titanium (Ti) overlying and directly onto the sidewalls 36 and the metal silicide regions 32 prior to depositing the barrier layer 46. As used herein, the term "substantially pure titanium" means titanium having no more than about 2% impurities. In one example, the conductive layer 48 is formed by depositing the substantially pure Ti using a physical vapor deposition (PVD) process. In an exemplary embodiment, the conductive layer 48 has a thickness (indicated by double headed arrow 49) of from about 1 to about 10 nm, such as from about 4 to about 6 nm, for example about 5 nm.

Referring to FIGS. 3 and 4B, in an exemplary embodiment, one or more of the liners 42 may also include a nucleation layer 50. As illustrated, the nucleation layer 50 is deposited onto the barrier layer 46 overlying the sidewalls 36 and the metal silicide regions 32. The nucleation layer 50 helps facilitate bonding between copper and the corresponding liner 42.

In an exemplary embodiment, the nucleation layer 50 is formed of tungsten (W) and/or ruthenium (Ru). In one example, the nucleation layer 50 is formed by depositing W and/or Ru onto the barrier layer 46 using a CVD process or an ALD process. In an exemplary embodiment, the nucleation layer 50 has a thickness (indicated by double headed arrow 51) of from about 1 to about 10 nm, such as from about 1 to about 3 nm, for example about 2 nm.

Figure 5A:
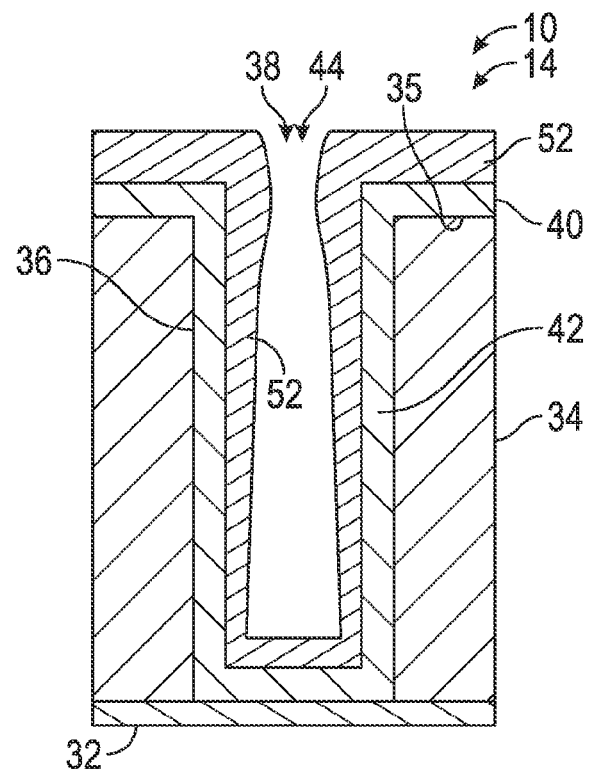

FIGS. 5A-5E illustrate, in cross sectional views, a portion of the IC 10 including one of the contact openings 38, which represents one or more of the contact openings 38, at further advanced fabrication stages in accordance with an exemplary embodiment. The process continues as illustrated in FIG. 5A by depositing a copper seed layer 52 over the liner-forming material 40. As such, the copper seed layer 52 is disposed over the liner 42 inside of the inner cavity 44 and over the liner-forming material 40 that overlies the top surface 35 of the ILD layer 34. In one example, the copper seed layer 52 is deposited using a CVD process. In an exemplary embodiment, the copper seed layer 52 has an overall thickness of from about 1 to about 10 nm. Notably, as illustrated in FIG. 5A, although the copper seed layer 52 is a relatively thin layer, the deposition of copper substantially narrows the contact opening 38 laterally adjacent to the top surface 35 of the ILD layer 34 due to the buildup of material such that subsequent filling of the inner cavity 44 with copper without forming voids using conventional processes would be challenging.

Figure 5B:
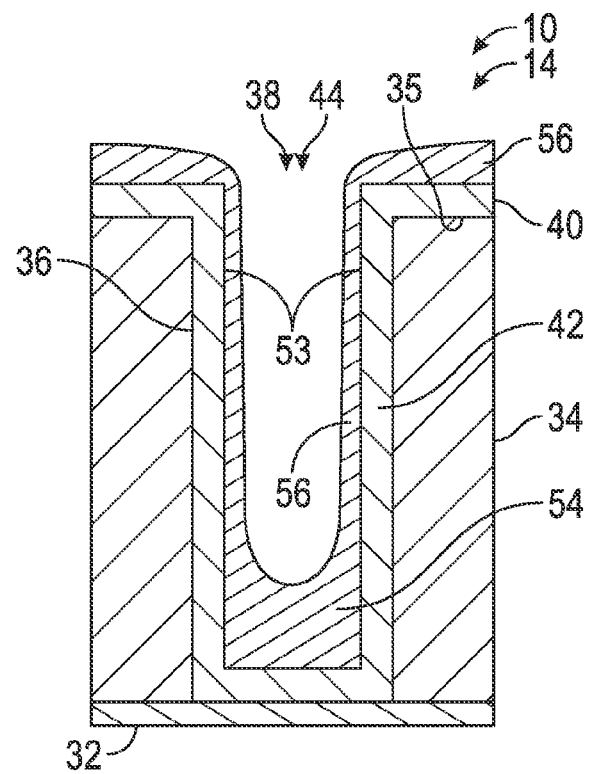

Referring also to FIG. 5B, the copper seed layer 52 is reflowed to redistribute some of the copper disposed over the liner-forming material 40 above the top surface 35 of the ILD layer 34 and on an upper portion 53 of the liner 42 to a bottom portion 54 of the inner cavity 44 to form a reflowed copper seed layer 56. As illustrated, the reflowed copper seed layer 56 partially fills the inner cavity 44. In an exemplary embodiment, the reflowed copper seed layer 56 is formed by exposing the copper seed layer 52 to a temperature of from about 200 to about 300° C. for a time of from about 30 seconds to about 15 minutes.

Figure 5C:
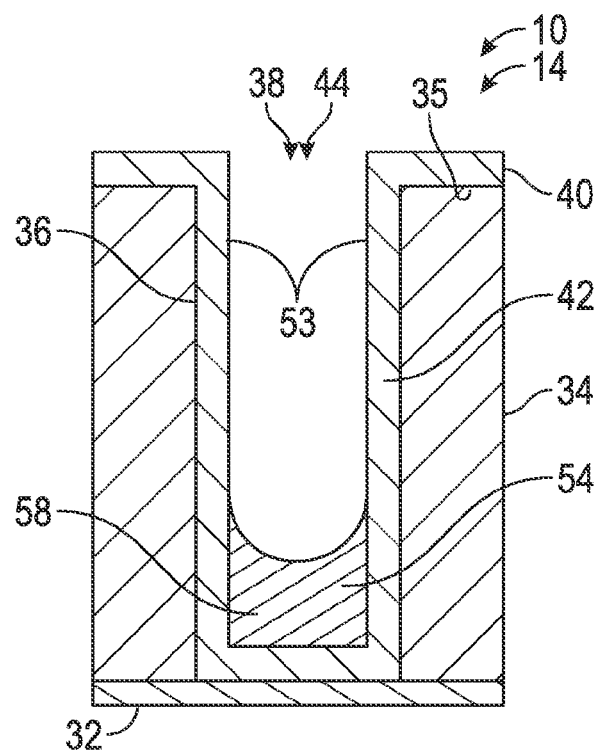

The process continues by etching the reflowed copper seed layer 56 as illustrated in FIG. 5C using a dry or wet etching process. One example of a wet etch is to use $NH_4OH:H_2O_2:H_2O$ at about a 1:1.5:26 ratio at about 25 to about 60° C. for about 1 to about 10 minutes. Another example is to use very dilute HCl at about room temperature. A third example is to use about 1% citric acid at about 60° C. after the copper is oxidized by a chemistry containing an oxidizer such as peroxide. In an exemplary embodiment, after etching, the upper portion of the liner 42 is exposed and substantially free of copper while a portion 58 of copper remains in the bottom portion 54 of the inner cavity 44. After recess, the bottom portion 54 may have about 2 to about 20 nm of Cu remaining (defining a thickness of the portion 58) in the bottom portion 78.

Figure 5D:
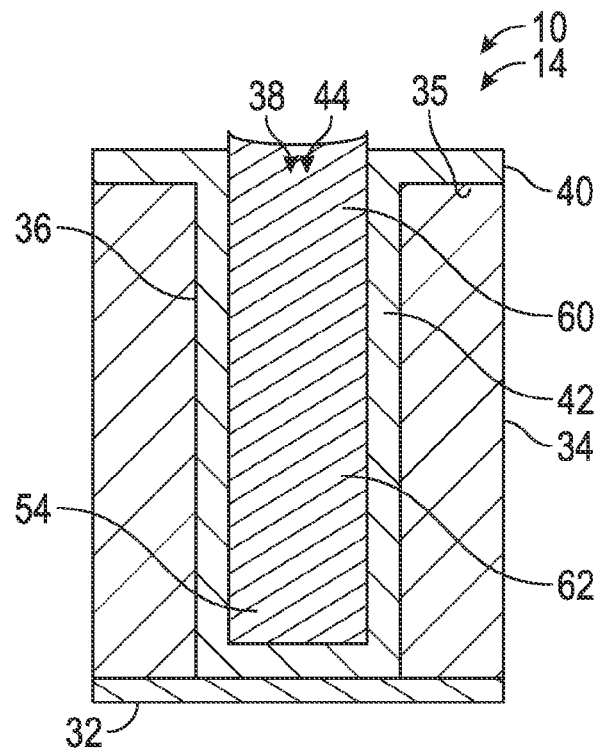

Referring also to FIG. 5D, in an exemplary embodiment, copper is then electrolessly deposited by exposing the device region 14 to an electroless deposition solution, which deposits and grows copper only in areas of the device region 14 where copper is already present. As illustrated, copper is deposited on and grows upward from the portion 58 of copper disposed in the bottom portion 54 (see FIG. 5C) to fill a remaining portion 60 of the inner cavity 44 to form a copper plug 62. Because copper is present only in the bottom portion 54 of the inner cavity 44 when the device region 14 is exposed to the electroless deposition solution, copper grows substantially in a single direction from the bottom portion 54 of the inner cavity 44 upward to fill the inner cavity 44 so that the copper plug 62 is substantially void-free.

Electroless deposition solutions for copper are well known and typically include, for example, a source of copper ions, a reducing agent, and a complexing agent and/or a chelating agent. In an exemplary embodiment, the electroless deposition process occurs with the electroless deposition solution at a temperature of from about 20 to about 100° C. and for a time sufficient to permit copper to backfill the inner cavity 44 of the contact openings 38.

Figure 5E:
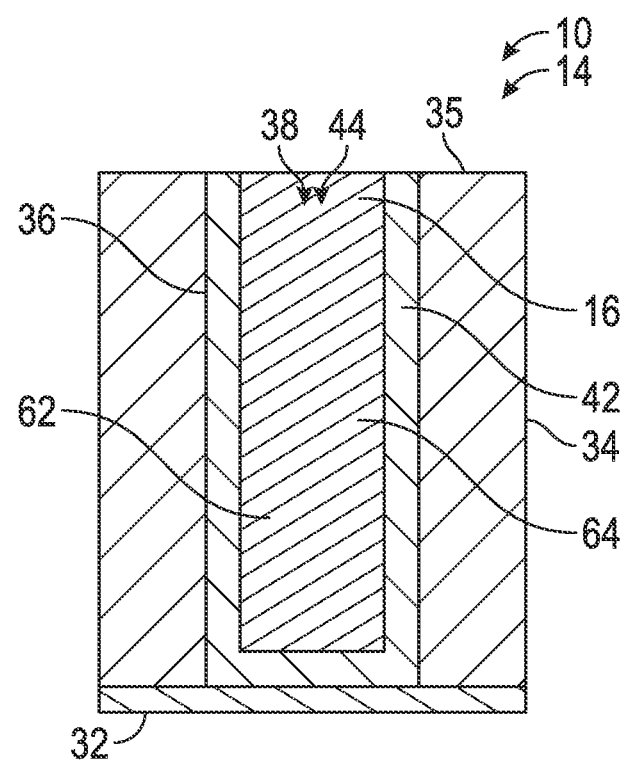
Figure 8:
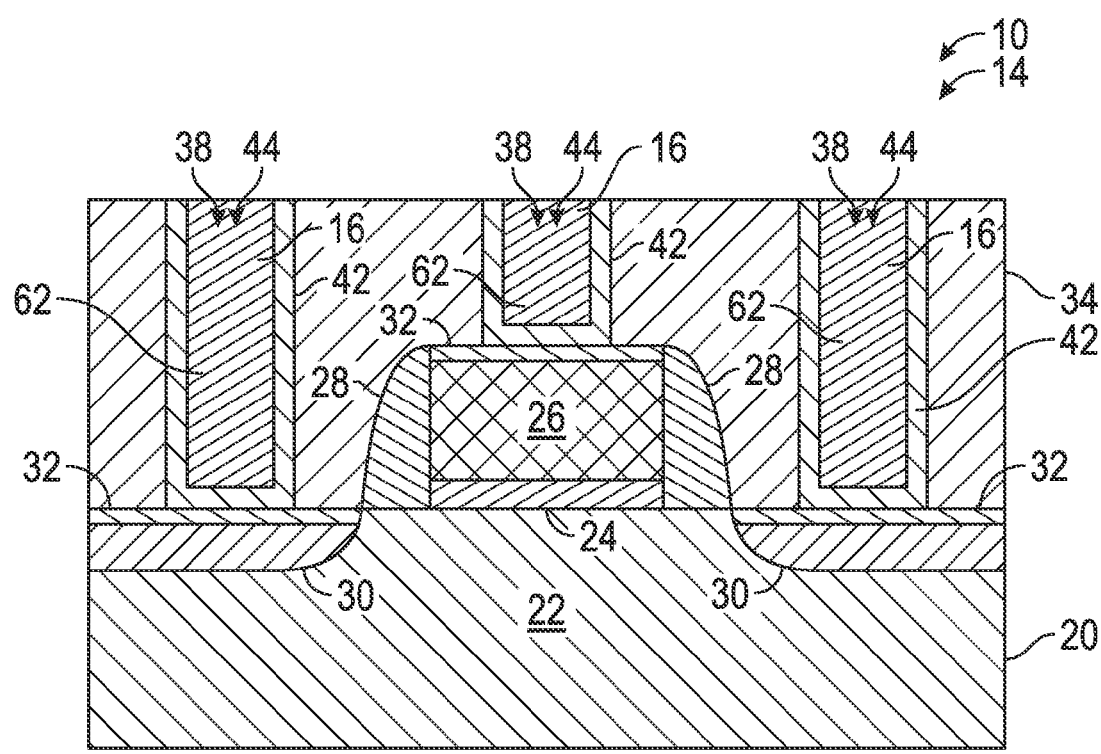

In an exemplary embodiment, the process continues as illustrated in FIG. 5E by annealing the copper plug 62 to form annealed copper 64. In one example, the copper plug 62 is annealed by exposing the copper plug 62 to a temperature of from about 100 to about 400° C. for a time of from about 15 minutes to about 2 hours (Inventors please confirm). Next, the liner-forming material 40 that overlies the top surface 35 of the ILD layer 34, an upper-most portion the liner 42, and any excess of the annealed copper 64 that is disposed adjacent to the upper-most portion of the liner 42 are removed using a CMP process to finish fabrication of the device contact(s) 16 and form the IC 10 as illustrated in FIG. 8.

Figure 6A:
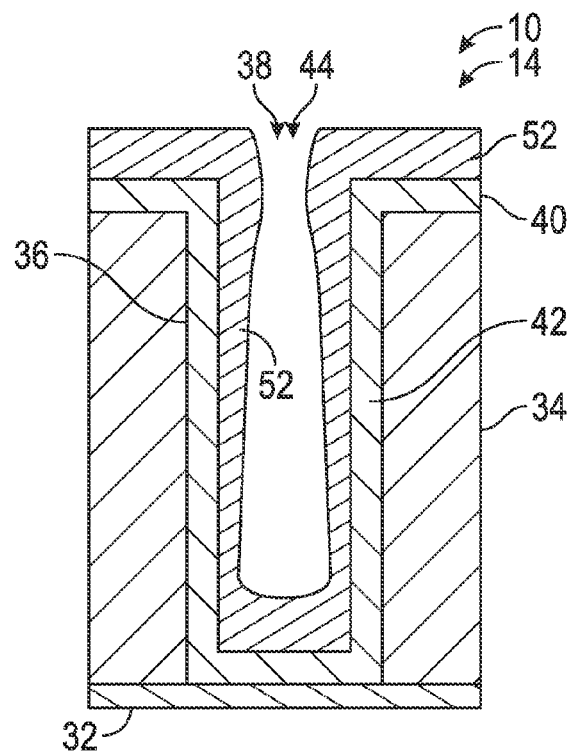

FIGS. 6A-6F illustrate, in cross sectional views, a portion of the IC 10 including one of the contact openings 38, which represents one or more of the contact openings 38, at further advanced fabrication stages after the fabrication stage illustrated in FIG. 3 in accordance with another exemplary embodiment. The process continues as illustrated in FIG. 6A by depositing a copper seed layer 52 over the liner-forming material(s) 40 as discussed above in relation to FIG. 5A. As such, the copper seed layer 52 is disposed over the liner 42 inside of the inner cavity 44 and over the liner-forming material 40 that overlies the top surface 35 of the ILD layer 34.

Figure 6B:
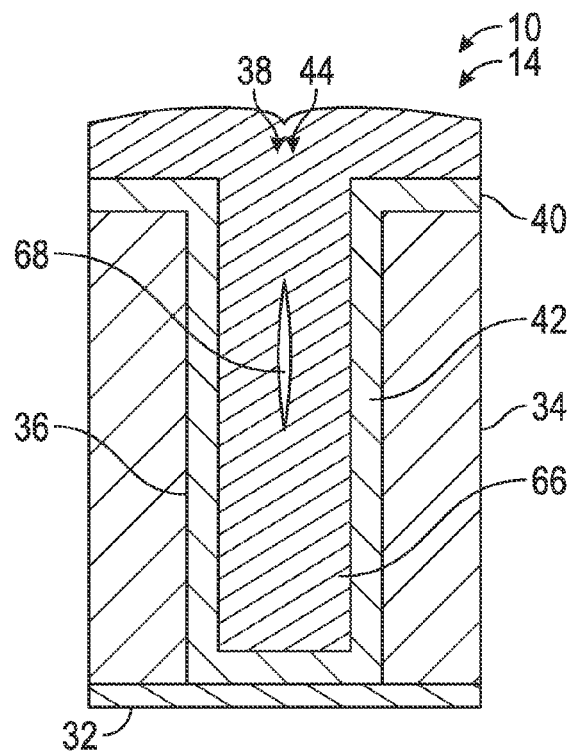

Referring also to FIG. 6B, the process continues by depositing a layer of copper on the copper seed layer 52 to form a copper fill 66 that fills the inner cavity 44. As illustrated, a space(s) or void(s) 68 may be formed in the copper fill 66 particularly if the contact opening 38 is relatively narrow and/or has a relatively high aspect ratio. In an exemplary embodiment, the layer of copper is deposited onto the copper seed layer 52 using an electroplating process or a physical vapor deposition (PVD) process.

Figure 6C:
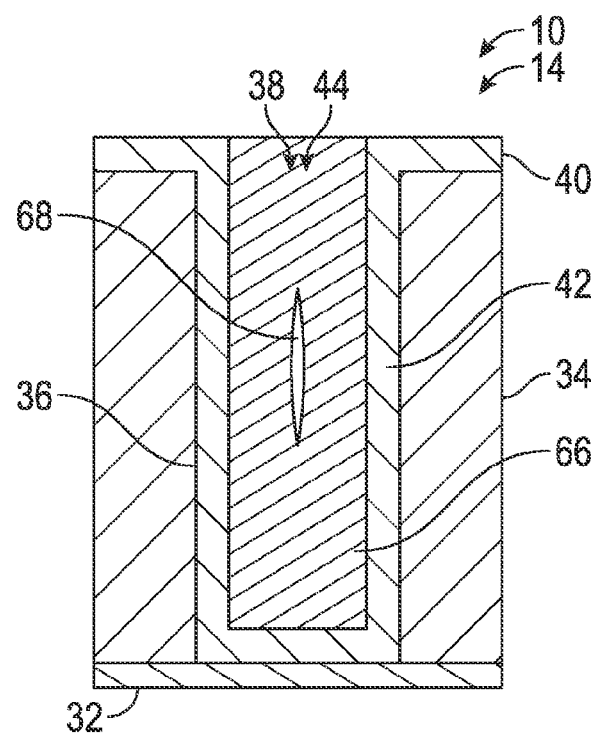
Figure 6D:
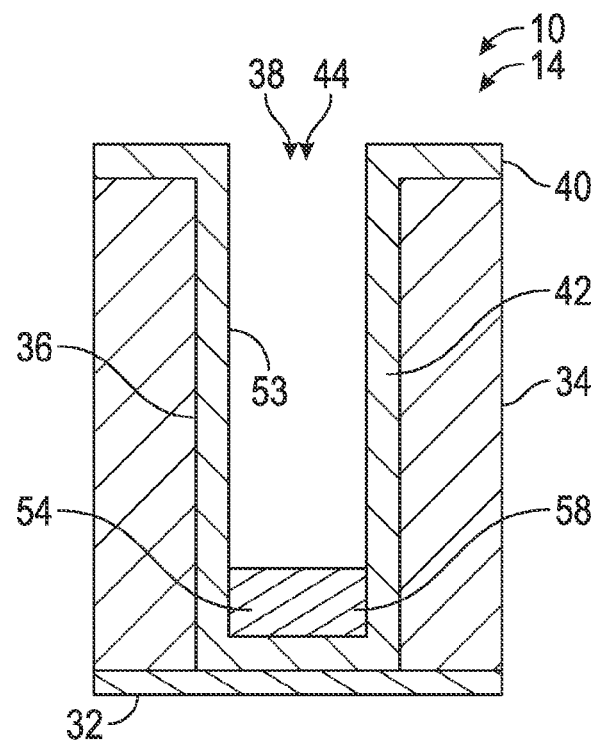

Referring to FIGS. 6C and 6D, copper disposed above the liner-forming material 40 that overlies the top surface 35 of the ILD layer 34 is removed via a CMP process, and the copper fill 66 is etched using a well-known dry or wet etching process. In an exemplary embodiment, after etching, the upper portion 53 of the liner 42 is exposed and substantially free of copper while the portion 58 of copper remains in the bottom portion 54 of the inner cavity 44. As illustrated, the void(s) 68 present in the copper fill 66 is removed after etching so that the portion 58 of copper in the bottom portion 54 of the inner cavity 44 is substantially solid.

Figure 6E:
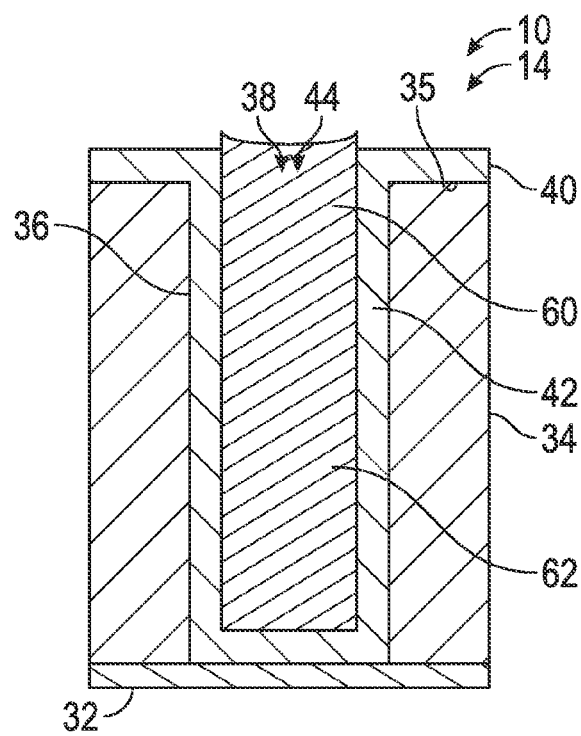

Referring to FIGS. 6D and 6E, in an exemplary embodiment and as discussed in relation to FIGS. 5C and 5D, copper is then electrolessly deposited by exposing the device region 14 to an electroless deposition solution, which deposits and grows copper only in areas of the device region 14 where copper is already present. As illustrated, copper is deposited on and grows upward from the portion 58 of copper disposed in the bottom portion 54 (see FIG. 6D) to fill the remaining portion 60 of the inner cavity 44 to form the copper plug 62 that is substantially void-free.

Figure 6F:
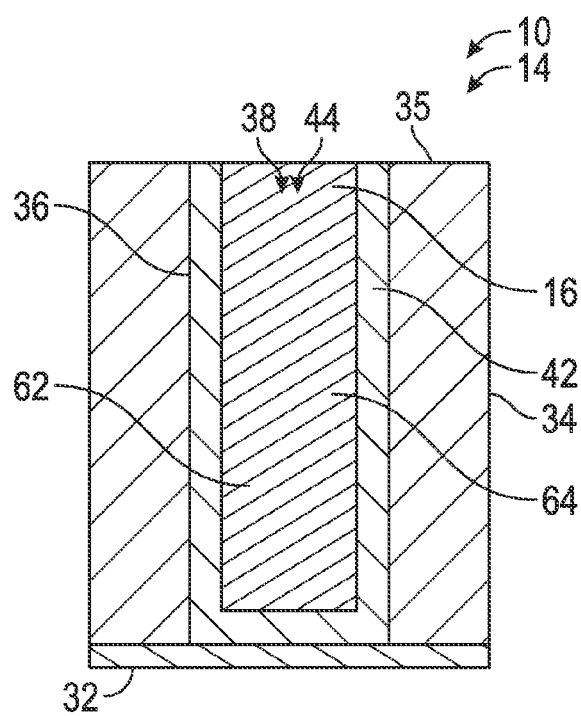

In an exemplary embodiment, the process continues as illustrated in FIG. 6F and as discussed above in relation to FIG. 5E by annealing the copper plug 62 to form annealed copper 64. Next, the liner-forming material 40 that overlies the top surface 35 of the ILD layer 34, the upper-most portion the liner 42, and any excess of the annealed copper 64 that is disposed adjacent to the upper-most portion of the liner 42 are removed using a CMP process to finish fabrication of the device contact(s) 16 and form the IC 10 as illustrated in FIG. 8.

Figure 7A:
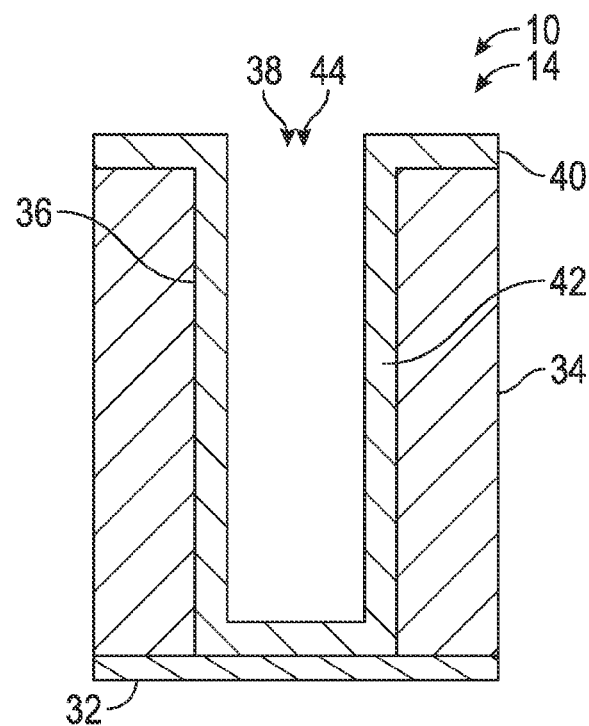
Figure 7B:
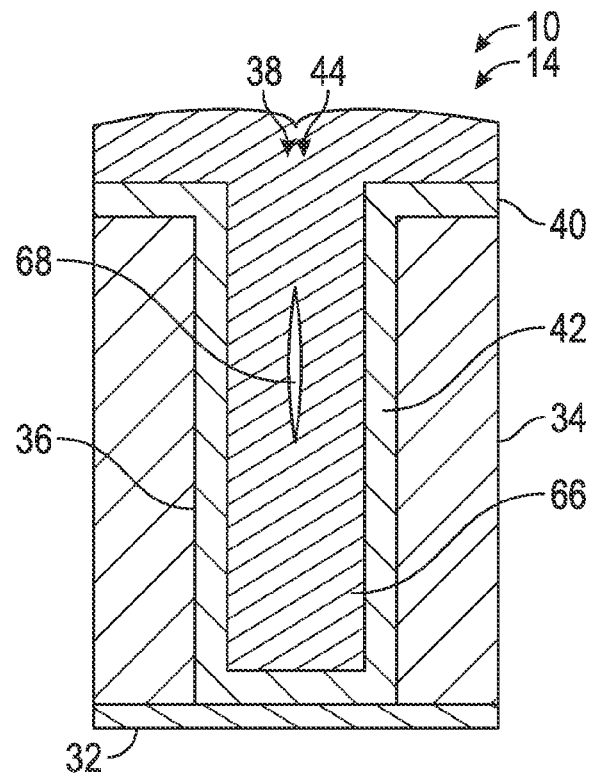

FIGS. 7A-7F illustrate, in cross sectional views, a portion of the IC 10 including one of the contact openings 38, which represents one or more of the contact openings 38, at further advanced fabrication stages after the fabrication stage illustrated in FIG. 3 in accordance with another exemplary embodiment. The process continues similarly to the exemplary embodiment illustrated in FIGS. 6A-6F except without the deposition of the copper seed layer 52 illustrated in FIG. 6A. Rather, and as illustrated in FIGS. 7A-7B, a layer of copper is deposited directly on the liner-forming material 40 including the liner 42 to form the copper fill 66 that fills the inner cavity 44. As illustrated, a space(s) or void(s) 68 may be formed in the copper fill 66 particularly if the contact opening 38 is relatively narrow and/or has a relatively high aspect ratio.

Figure 7C:
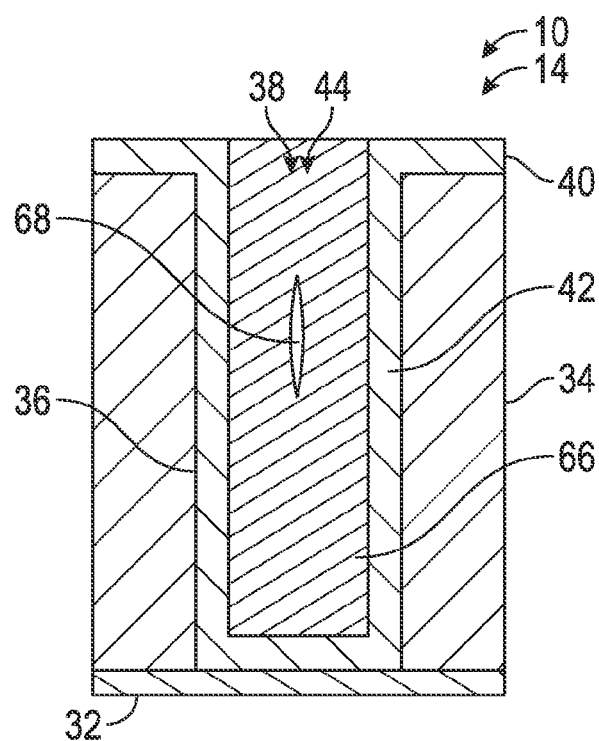
Figure 7D:
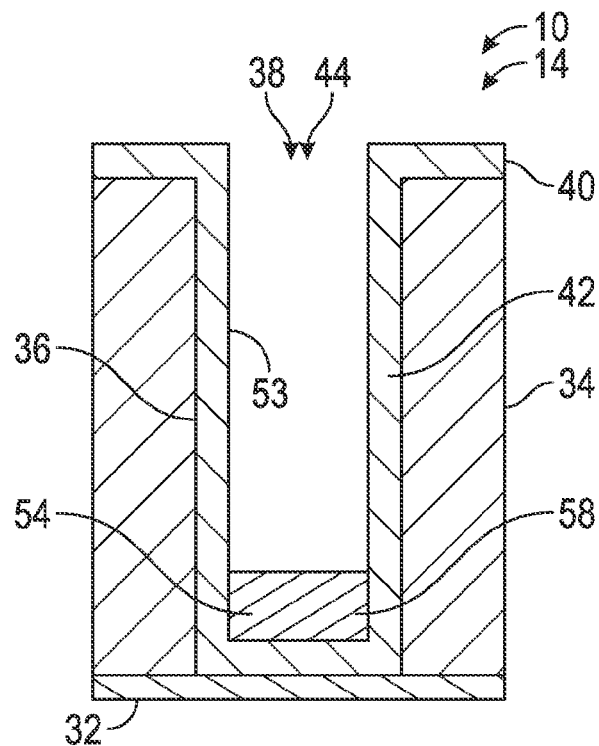

Referring to FIGS. 7C and 7D, copper disposed above the liner-forming material 40 that overlies the top surface 35 of the ILD layer 34 is removed via a CMP process, and the copper fill 66 is etched using a well-known dry or wet etching process. In an exemplary embodiment, after etching, the upper portion 53 of the liner 42 is exposed and substantially free of copper while a portion 58 of copper remains in the bottom portion 54 of the inner cavity 44. As illustrated, the void(s) 68 present in the copper fill 66 is removed after etching so that the portion 58 of copper in the bottom portion 54 of the inner cavity 44 is substantially solid.

Figure 7E:
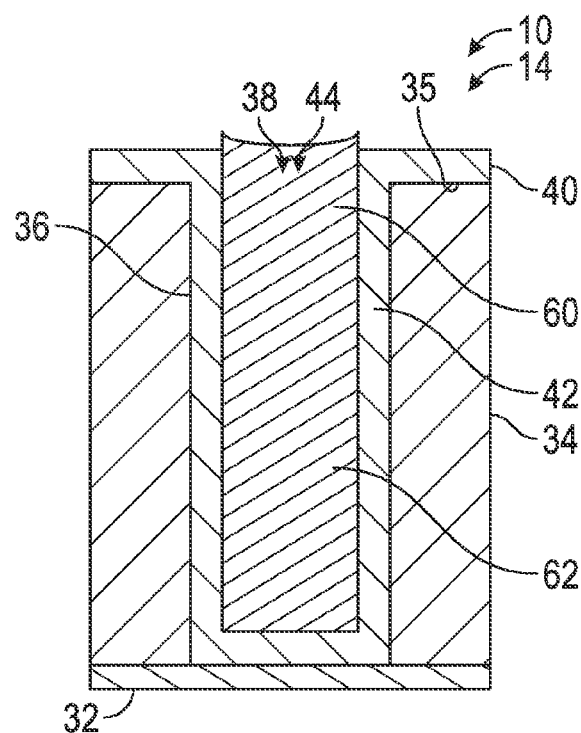

Referring to FIGS. 7D and 7E, in an exemplary embodiment and as discussed above, copper is then electrolessly deposited by exposing the device region 14 to an electroless deposition solution, which deposits and grows copper only in areas of the device region 14 where copper is already present. As illustrated, copper is deposited on and grows upward from the portion 58 of copper disposed in the bottom portion 54 (see FIG. 7D) to fill the remaining portion 60 of the inner cavity 44 to form the copper plug 62 that is substantially void-free.

Figure 7F:
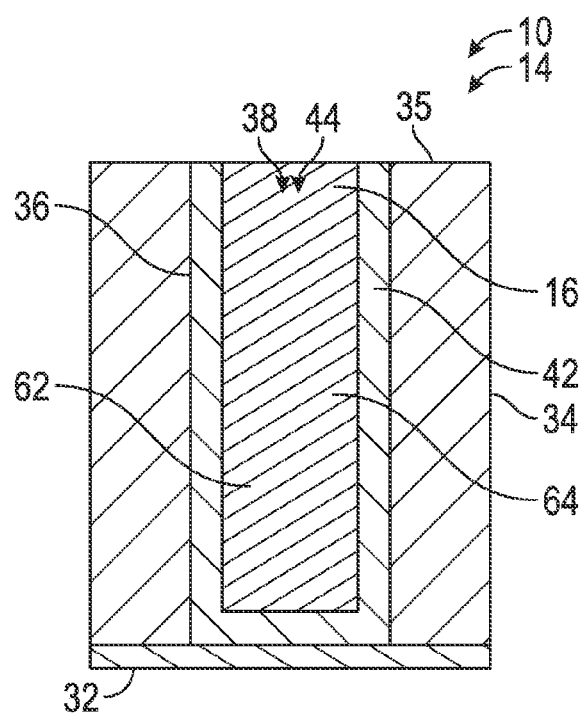

In an exemplary embodiment, the process continues as illustrated in FIG. 7F and discussed above by annealing the copper plug 62 to form annealed copper 64. Next, the liner-forming material 40 that overlies the top surface 35 of the ILD layer 34, the upper-most portion the liner 42, and any excess of the annealed copper 64 that is disposed adjacent to the upper-most portion of the liner 42 are removed using a CMP process to finish fabrication of the device contact(s) 16 and form the IC 10 as illustrated in FIG. 8.

Accordingly, methods for fabricating integrated circuits having low resistance device contacts have been described. During intermediate stages of the fabrication of an integrated circuit (IC), an ILD layer of insulating material is formed overlying a device region that includes a metal silicide region. The ILD layer is etched to form a sidewall that defines a contact opening. The contact opening is formed through the ILD layer exposing the metal silicide region. A liner is formed overlying the sidewall and the metal silicide region and defines an inner cavity in the contact opening. A copper layer is formed overlying the liner and at least partially fills the inner cavity. The copper layer is etched to remove copper from an upper portion of the liner, thereby exposing the upper portion of the liner, while leaving some copper disposed in a bottom portion of the inner cavity. Copper is then electrolessly deposited on the copper in the bottom portion to fill a remaining portion of the inner cavity with copper and form a substantially void-free copper plug. In an exemplary embodiment, the substantially void-free copper plug is a substantially solid, highly conductive copper plug that effectively functions as a relatively low resistance device contact.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit having a device contact, the method comprising:
    depositing an ILD layer of insulating material overlying a device region that includes a metal silicide region;
    etching the ILD layer to form a sidewall that defines a contact opening formed through the ILD layer exposing the metal silicide region;
    forming a liner overlying the sidewall and the metal silicide region and defining an inner cavity in the contact opening;
    forming a copper layer that overlies the liner and at least partially fills the inner cavity;
    etching the copper layer to expose an upper portion of the liner while leaving a copper portion disposed in a bottom portion of the inner cavity; and
    electrolessly depositing copper on the copper portion to fill a remaining portion of the inner cavity.

2. The method of claim 1, wherein forming the liner comprises depositing a barrier layer overlying the sidewall and the metal silicide region, and wherein the barrier layer comprises TiN and/or TaN.

3. The method of claim 2, wherein depositing the barrier layer comprises forming the barrier layer using a chemical vapor deposition process or an atomic layer deposition process.

4. The method of claim 2, wherein depositing the barrier layer comprises forming the barrier layer having a thickness of from about 1 to about 10 nm.

5. The method of claim 2, wherein forming the liner comprises depositing substantially pure Ti overlying the sidewall and the metal silicide region to form a conductive layer, and wherein depositing the barrier layer comprises depositing the barrier layer overlying the conductive layer.

6. The method of claim 5, wherein depositing the substantially pure Ti comprises forming the conductive layer using a physical vapor deposition process.

7. The method of claim 5, wherein depositing the substantially pure Ti comprises forming the conductive layer having a thickness of from about 1 to about 10 nm.

8. The method of claim 2, wherein forming the liner comprises depositing a nucleation layer overlying the barrier layer, and wherein the nucleation layer comprises W and/or Ru.

9. The method of claim 8, wherein depositing the nucleation layer comprises forming the nucleation layer using a chemical vapor deposition process or an atomic layer deposition process.

10. The method of claim 8, wherein depositing the nucleation layer comprises forming the nucleation layer having a thickness of from about 1 to about 10 nm.

11. The method of claim 1, further comprising:
    annealing copper disposed in the inner cavity to form annealed copper after electrolessly depositing copper.

12. The method of claim 11, wherein annealing copper comprises exposing copper disposed in the inner cavity to a temperature of from about 100 to about 400° C.

13. The method of claim 12, wherein annealing copper comprises exposing copper disposed in the inner cavity to the temperature for a time of from about 30 minutes to about 2 hours.

14. The method of claim 11, further comprising:
    removing an upper-most portion of the liner and an excess portion of the annealed copper disposed adjacent to the upper-most portion of the liner using a chemical mechanical planarization process.

15. A method for fabricating an integrated circuit having a device contact, the method comprising:
    forming an ILD layer of insulating material overlying a device region that includes a metal silicide region;
    etching the ILD layer to form a sidewall that defines a contact opening formed through the ILD layer exposing the metal silicide region;
    forming a liner overlying the sidewall and the metal silicide region and defining an inner cavity in the contact opening;
    depositing a copper seed layer overlying the liner;
    reflowing the copper seed layer to form a reflowed copper seed layer that partially fills the inner cavity;
    etching the reflowed copper seed layer to expose an upper portion of the liner while leaving a copper portion disposed in a bottom portion of the inner cavity; and
    electrolessly depositing copper on the copper portion to fill a remaining portion of the inner cavity.

16. The method of claim 15, wherein reflowing the copper seed layer comprises exposing the copper seed layer to a temperature of from about 200 to about 300° C.

17. A method for fabricating an integrated circuit having a device contact, the method comprising:
    forming an ILD layer of insulating material overlying a device region that includes a metal silicide region;
    etching the ILD layer to form a sidewall that defines a contact opening formed through the ILD layer exposing the metal silicide region;
    forming a liner overlying the sidewall and the metal silicide region and defining an inner cavity in the contact opening;
    filling the inner cavity with copper to define a copper fill;
    etching the copper fill to expose an upper portion of the liner while leaving a copper portion disposed in a bottom portion of the inner cavity; and
    electrolessly depositing copper on the copper portion to fill a remaining portion of the inner cavity.

18. The method of claim 17, wherein filling the inner cavity comprises:
    depositing a copper seed layer overlying the liner;
    reflowing the copper seed layer to form a reflowed copper seed layer that partially fills the inner cavity; and
    depositing copper on the reflowed copper seed layer to form the copper fill.

19. The method of claim 17, wherein filling the inner cavity comprises:
    depositing copper directly on the liner to form the copper fill.

20. The method of claim 17, wherein filling the inner cavity comprises:
    depositing copper overlying the liner using an electroplating process or a physical vapor deposition process.

* * * * *